United States Patent
Nonoue et al.

(10) Patent No.: US 7,229,939 B2
(45) Date of Patent: Jun. 12, 2007

(54) MULTILAYER CERAMIC SUBSTRATE AND METHOD FOR MANUFACTURE THEREOF

(75) Inventors: Hiroshi Nonoue, Hirakata (JP); Hideki Yoshikawa, Takarazuka (JP); Kenichiro Wakisaka, Iga (JP)

(73) Assignee: Sanyo Electric Co., Ltd., Osaka (JP)

( * ) Notice: Subject to any disclaimer, the term of this patent is extended or adjusted under 35 U.S.C. 154(b) by 132 days.

(21) Appl. No.: 11/085,564

(22) Filed: Mar. 22, 2005

(65) Prior Publication Data

US 2005/0221068 A1    Oct. 6, 2005

(30) Foreign Application Priority Data

Mar. 30, 2004    (JP)    ............... 2004-098478

(51) Int. Cl.
*C03C 10/06*    (2006.01)
*H05K 3/46*    (2006.01)
*B32B 3/00*    (2006.01)

(52) U.S. Cl. ..................... 501/8; 501/32; 428/209; 428/210; 65/33.7

(58) Field of Classification Search .............. 501/8, 501/32; 428/209, 10, 210
See application file for complete search history.

(56) References Cited

U.S. PATENT DOCUMENTS

| 5,338,710 | A | * | 8/1994 | Ishigame et al. ............. 501/32 |
| 6,133,175 | A | * | 10/2000 | Bethke et al. ................. 501/8 |
| 2005/0214516 | A1 | * | 9/2005 | Yoshikawa et al. ......... 428/209 |

FOREIGN PATENT DOCUMENTS

| JP | 6-171981 | * | 6/1994 |
| JP | 6-171982 | | 6/1994 |
| JP | 2501740 | | 3/1996 |
| JP | 11-049531 | | 2/1999 |
| JP | 2000/43332 | * | 5/2000 |

* cited by examiner

*Primary Examiner*—Karl Group
(74) *Attorney, Agent, or Firm*—McDermott Will & Emery

(57) ABSTRACT

A multilayer ceramic substrate which is obtained by firing multilayers of ceramic green sheets each having a dielectric layer, made of a glass-ceramic material comprising a mixture of alumina and a glass containing at least Si and Ca, and an electrode layer made of Ag and formed on the dielectric layer. The dielectric layer after firing includes anorthite ($CaAl_2Si_2O_8$) crystals having a grain size of up to 84 nm.

6 Claims, 9 Drawing Sheets

MULTILAYER CERAMIC SUBSTRATE AND METHOD FOR MANUFACTURE THEREOF

The priority Japanese Patent Application Number 2004-98478 upon which this patent application is based is hereby incorporated by reference.

BACKGROUND OF THE INVENTION

1. Field of the Invention

The present invention relates to a multilayer ceramic substrate which is applicable for use in mobile communication terminals such as portable phones, and also to a method for manufacturing the multilayer ceramic substrate.

2. Description of Related Art

With the need of miniaturizing recently spread mobile communication equipment, such as portable phones, and portable communication terminals, the size reduction and performance increase of high-frequency circuit parts for use therein have been pursued.

In high-frequency circuit substrates, a conventional module including a printed substrate and a capacitor or inductor mounted on its surface has been increasingly replaced by a smaller size module consisting of multilayers of dielectric ceramic substrates each patterned with a capacitor or inductor circuit.

The multilayer ceramic substrate is generally fabricated by providing multilayers of green sheets, such as glass-ceramics, each carrying a predetermined circuit pattern formed by screen printing or the like, and firing the multilayers of green sheets at a temperature of about 900° C. A popular material used for the circuit pattern is silver (Ag) which is highly conductive and air-firable.

However, due to a high tendency of silver to exhibit a migration phenomenon, short circuit defect often occurs between silver wiring electrodes separated by a dielectric layer, which has been a problem.

Japanese Patent Laying-Open No. Hei 11-49531 describes that inclusion of CuO in a glass component of a glass-ceramic for use in a dielectric layer suppresses ionization of Ag during a firing process and thus restrains Ag from diffusing into the glass ceramic.

Japanese Patent Registration No. 2,501,740 discloses a ceramic substrate obtained through low-temperature firing and including anorthite crystals. However, no description is provided as to the relation between the anorthite crystals and the Ag migration.

SUMMARY OF THE INVENTION

It is an object of the present invention to provide a multilayer ceramic substrate which shows the reduced occurrence of migration of silver (Ag) from an electrode layer while maintaining satisfactory mechanical strength, and also to provide a method for manufacturing the multilayer ceramic substrate.

The multilayer ceramic substrate of the present invention is obtained by firing multilayers of ceramic green sheets each having a dielectric layer, made of a glass-ceramic material comprising a mixture of alumina and a glass containing at least Si and Ca, and an electrode layer made of Ag and formed on the dielectric layer. Characteristically, the dielectric layer after firing includes anorthite ($CaAl_2Si_2O_8$) crystals having a crystal grain size of up to 84 nm.

The occurrence of migration of silver from the electrode layer can be reduced without reduction of mechanical strength if the crystal grain size of the anorthite crystals in the dielectric layer after firing is not greater than 84 nm.

A detailed reason why the occurrence of silver migration can be reduced if the crystal grain size of anorthite crystals is not greater than 84 nm is unclear. However, the following may explain the reason.

Glass reduces its amorphous portion as it crystallizes. This facilitates agglomeration of Ag diffused in the amorphous portions. Also, Ag moves along peripheries of crystal grains. Accordingly, if the crystal grains become larger, the Ag agglomerates move along those enlarged crystal grains to result in the increased occurrence of migration. Agglomeration of Ag diffused in the amorphous portions appears to be suppressed if the crystal grain size is not greater than 84 nm, as specified in the present invention. Also, the size reduction of crystal grains appears to reduce the occurrence of migration. It has been also found that the multilayer ceramic substrate does not show reduction in mechanical strength even if the grain size of the anorthite crystals decreases.

Therefore, in accordance with the present invention, the occurrence of migration of silver from the electrode layer can be reduced without loss of mechanical strength.

In the present invention, the type of the glass in the glass-ceramic material is not particularly specified, so long as it contains at least Si and Ca. Preferably, a borosilicate glass is used.

Also, the glass-ceramic material in the present invention contains alumina as a ceramic component. However, other types of ceramic components may also be contained.

The glass component may have a composition comprising 5–30% by weight of CaO, 30–95% by weight of $SiO_2$, 0–20% by weight of MgO, 0–15% by weight of ZnO, 0–40% by weight of $B_2O_3$, 0–5% by weight of $Li_2O$, 0–10% by weight of $K_2O$ and 0–10% by weight of $Al_2O_3$, for example.

The glass-ceramic material in the present invention preferably contains 30–60% by weight of the glass component and 70–40% by weight of the alumina component.

In the present invention, a crystal grain size (crystal grain diameter) of the anorthite crystals can be calculated according to the following procedure using a Scherrer equation.

(i) A half-width of a peak at 28.1°, as observed by the X-ray diffraction analysis, is corrected using the following equation (1) to determine an integrated width:

$$\beta(\text{degrees}) = \text{half-width of a peak at } 28.1° - (-0.0017 \times 28.1 + 0.2298) \quad (1)$$

(ii) The value of $\beta$, as calculated from the equation (1), is inserted in the following equation (2) to calculate a crystal grain size:

$$\text{Crystal grain size (nm)} = \lambda/(\beta \cos \theta) \quad (2)$$

In the equation (2), $\lambda$ is a wavelength (0.15405 nm) of an X-ray.

The method of the present invention is for manufacturing a multilayer ceramic substrate by firing multilayers of ceramic green sheets each having a dielectric layer, made of a glass-ceramic material comprising a mixture of alumina and a glass containing at least Si and Ca, and an electrode layer made of Ag and formed on the dielectric layer. Characteristically, the firing is performed such that the dielectric layer after firing includes anorthite crystals having a grain size of up to 84 nm.

In accordance with the method of the present invention, a multilayer ceramic substrate can be manufactured which can shows the reduced occurrence of migration of silver from an electrode layer without reduction of mechanical strength.

In the practice of the manufacturing method of the present invention, the following two firing methods can be utilized, for example.

In accordance with the first firing method, a maximum firing temperature is selected from the range of 820° C.–865° C. After reaching the maximum temperature, firing is continued for a period of between 1 hours and 2 hours until the temperature drops to the maximum temperature minus 50° C. More preferably, the maximum firing temperature is selected from the range of 840° C.–865° C. After reaching the maximum temperature, firing is continued for a period of between 1.5 hours and 2 hours until the temperature drops to the maximum temperature minus 50° C.

In accordance with the second firing method, a maximum firing temperature is selected from the range of 850° C.–900° C. After reaching the maximum temperature, firing is continued for a period within 40 minutes until the temperature drops to the maximum temperature minus 50° C. More preferably, the maximum firing temperature is selected from the range of 860° C.–880° C. After reaching the maximum temperature, firing is continued for a period within 40 minutes until the temperature drops to the maximum temperature minus 50° C. In this second firing method, a cooling rate from the maximum temperature is preferably at least 250° C./hour.

In accordance with the present invention, the occurrence of silver migration from the electrode layer can be reduced without loss of mechanical strength.

DESCRIPTION OF THE PREFERRED EXAMPLE

The following example illustrates the present invention but are not intended to be limiting thereof.

Figure 2:
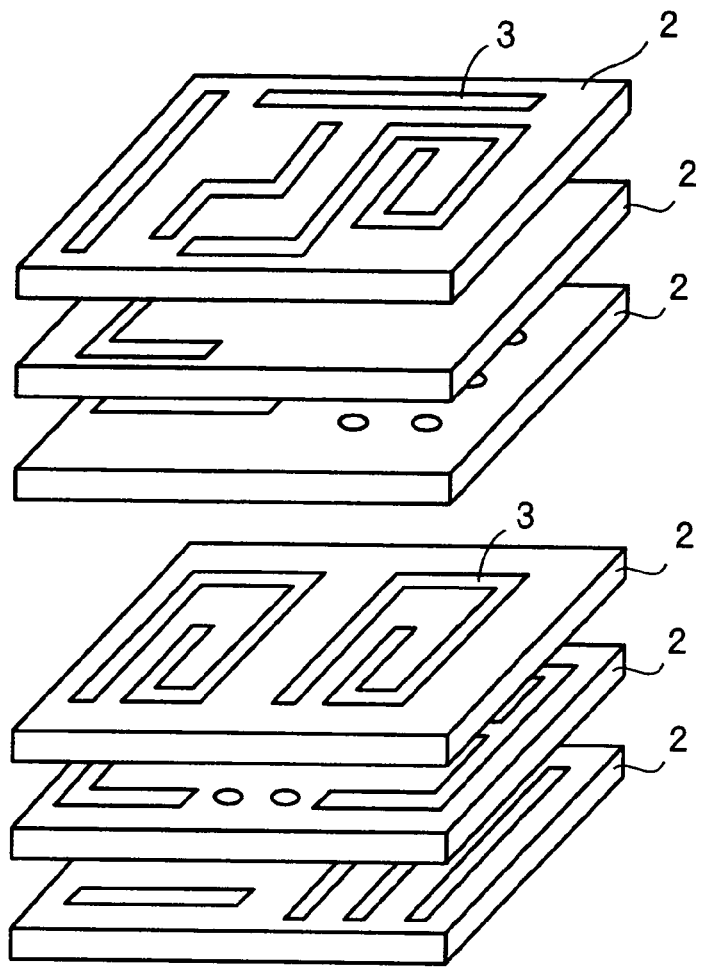
FIG. 2 is an exploded perspective view showing an embodiment of a multilayer ceramic substrate in accordance with the present invention.
Figure 3:
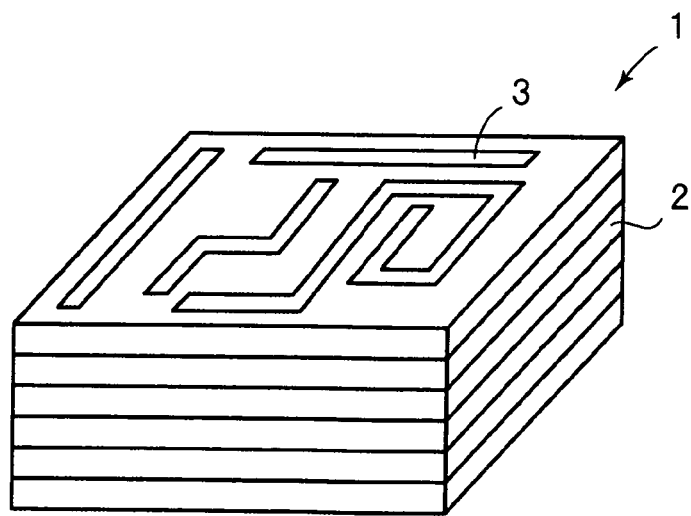
FIG. 3 is a perspective view showing an embodiment of a multilayer ceramic substrate in accordance with the present invention.

FIGS. 2 and 3 are an explode perspective view and a perspective view, respectively showing one embodiment of a multilayer ceramic substrate of the present invention. As shown in FIG. 2, an electrode layer 3 composed of silver is formed on a dielectric layer 2. Stacking and subsequent firing of such dielectric layers 2 results in obtaining a multilayer ceramic substrate 1 as shown in FIG. 3. An inductor or a capacitor, according to a circuit pattern of the electrode layer 3, is provided internally of the multilayer ceramic substrate 1.

Figure 4:
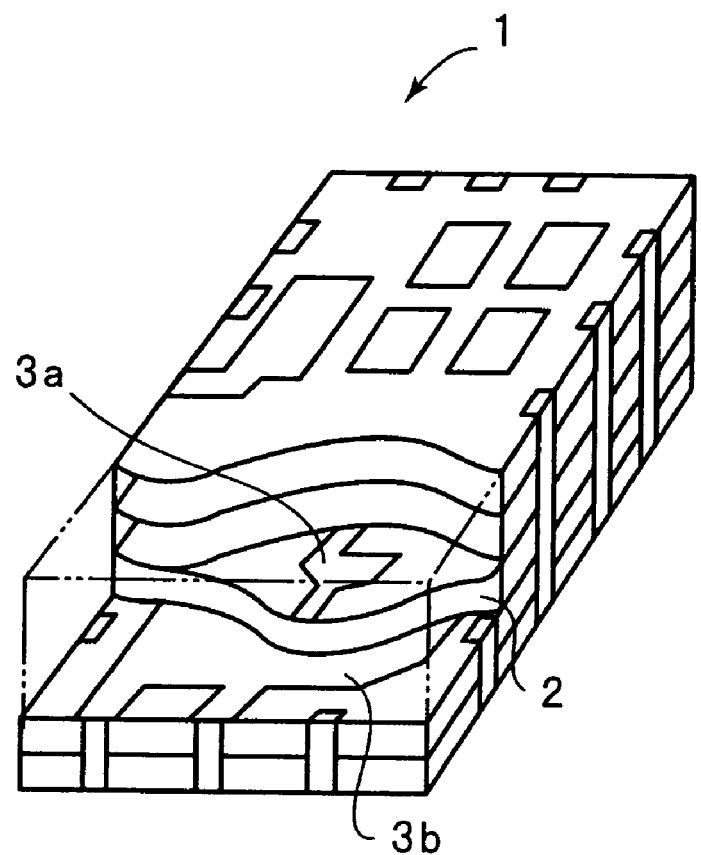
FIG. 4 is a partly cut-away perspective view showing an embodiment of a multilayer ceramic substrate in accordance with the present invention.

FIG. 4 is a partly cut-away perspective view of the multilayer ceramic substrate. As shown in FIG. 4, in the multilayer ceramic substrate 1, the neighboring electrode layers 3a and 3b are separated by the dielectric layer 2.

Figure 5:
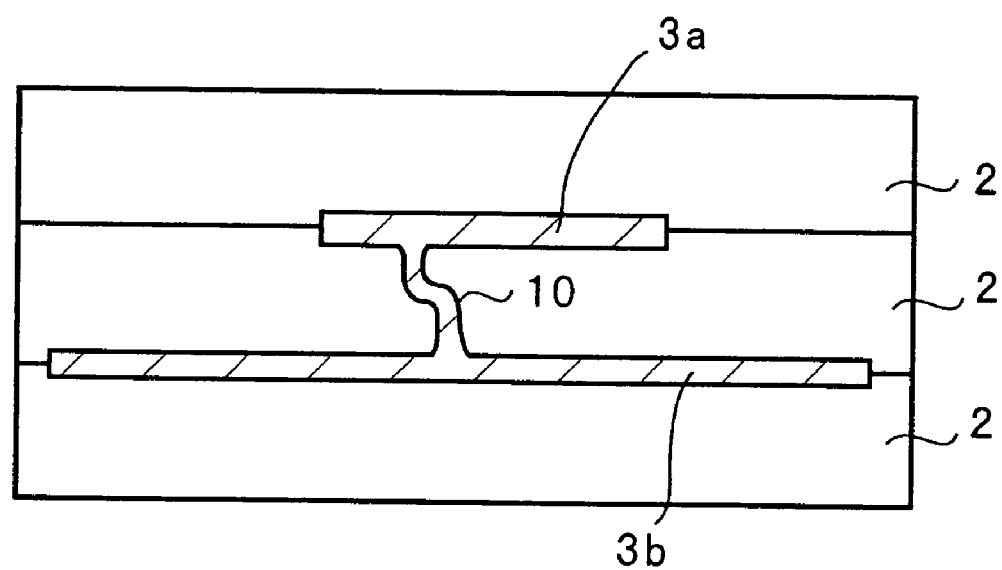
FIG. 5 is a sectional view which explains the occurrence of migration.

FIG. 5 is a sectional view which explains migration of the electrode layer. Application of a voltage across the electrode layers 3a and 3b separated by the dielectric layer 2 causes silver in the electrode layers 3a and 3b to diffuse into the dielectric layer 2, resulting in the occurrence of migration 10. When the migration 10 connects with the neighboring electrode layer or with a silver portion that migrates therefrom, short circuit occurs between the electrode layers 3a and 3b.

EXAMPLE

A ceramic green sheet was prepared by using a low-temperature firable glass-ceramic material containing a Ca-containing amorphous borosilicate glass and alumina in the ratio by weight of (30–60):(70–40). The glass-ceramic material had a composition comprising 44–52% by weight of $Al_2O_3$, 33–40% by weight of $SiO_2$, 8.0–13.0% by weight of CaO and 1.0–15.0% by weight of $B_2O_3$. The dielectric layer was about 50 μm. The Ag electrode layer was formed on the dielectric layer to a thickness of about 20 μm to prepare the ceramic green sheet.

Figure 10:
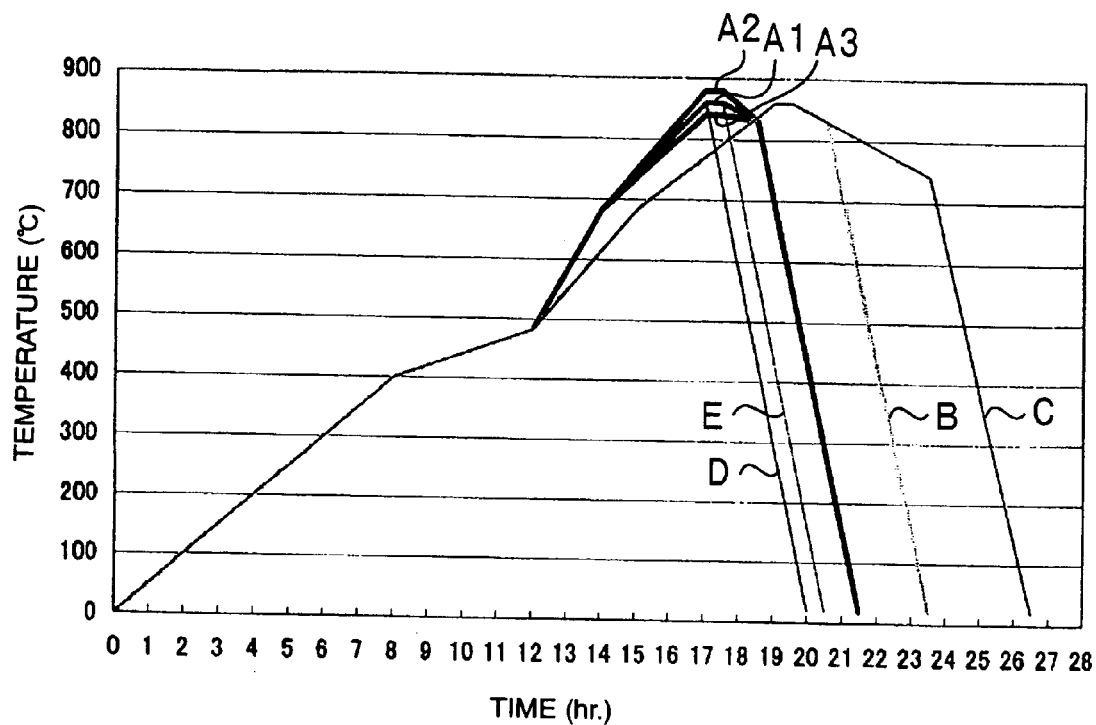
FIG. 10 is a graph showing firing profiles A1–A3 and B–E.

Using this ceramic green sheet, a multilayer ceramic substrate shown in FIGS. 2 and 3 was fabricated. Firing was performed according to the firing profiles A1–A3 and B–E, as shown in Table 1 and FIG. 10.

TABLE 1

| | Time | | | | | | | | | | | | | | |
|---|---|---|---|---|---|---|---|---|---|---|---|---|---|---|---|
| | 0 | 8 | 12 | 14 | 15 | 17 | 17.5 | 18.5 | 19 | 19.5 | 20 | 20.5 | 21.5 | 23.5 | 26.5 |
| A2 (Max. Temp. 880° C.) | 0 | 400 | 482 | 682 | | 880 | 880 | 832 | | | | 20 | | | |
| A1 (Max. Temp. 860° C.) | 0 | 400 | 482 | 682 | | 860 | 860 | 832 | | | | 20 | | | |
| A3 (Max. Temp. 840° C.) | 0 | 400 | 482 | 682 | | 840 | 840 | 832 | | | | 20 | | | |
| B | 0 | 400 | 482 | | 682 | | | | 860 | 860 | | 832 | | 20 | |
| C | 0 | 400 | 482 | | 682 | | | | 860 | 860 | | | | 742 | 20 |
| D | 0 | 400 | 482 | 682 | | 860 | | | | | 20 | | | | |
| E | 0 | 400 | 482 | 682 | | 860 | 860 | | | | | 20 | | | |

Figure 11:
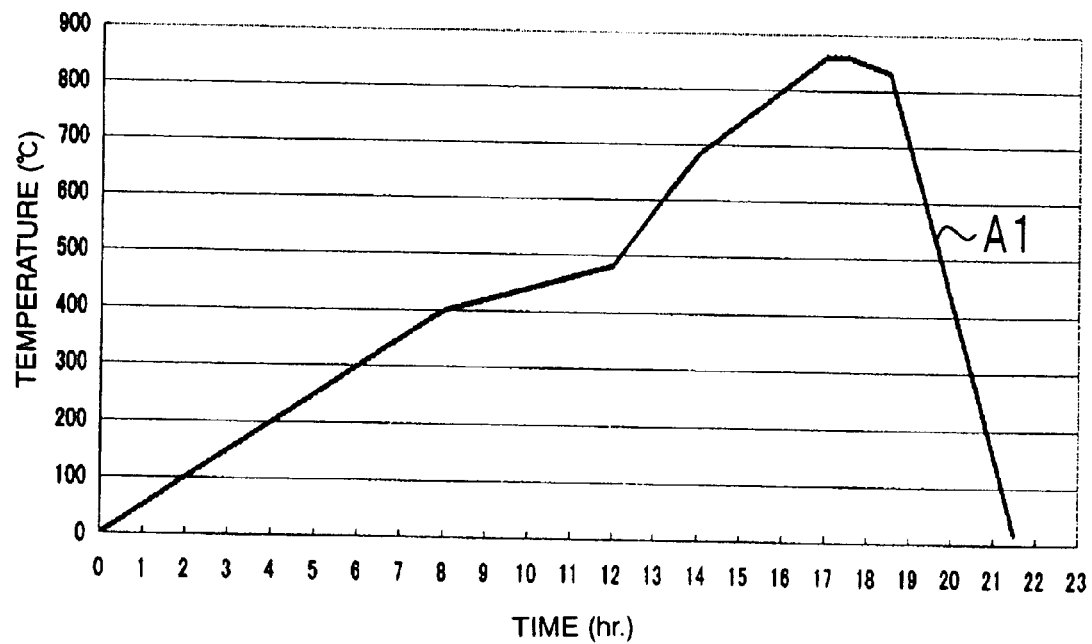
FIG. 11 is a graph showing the firing profile A1.
Figure 12:
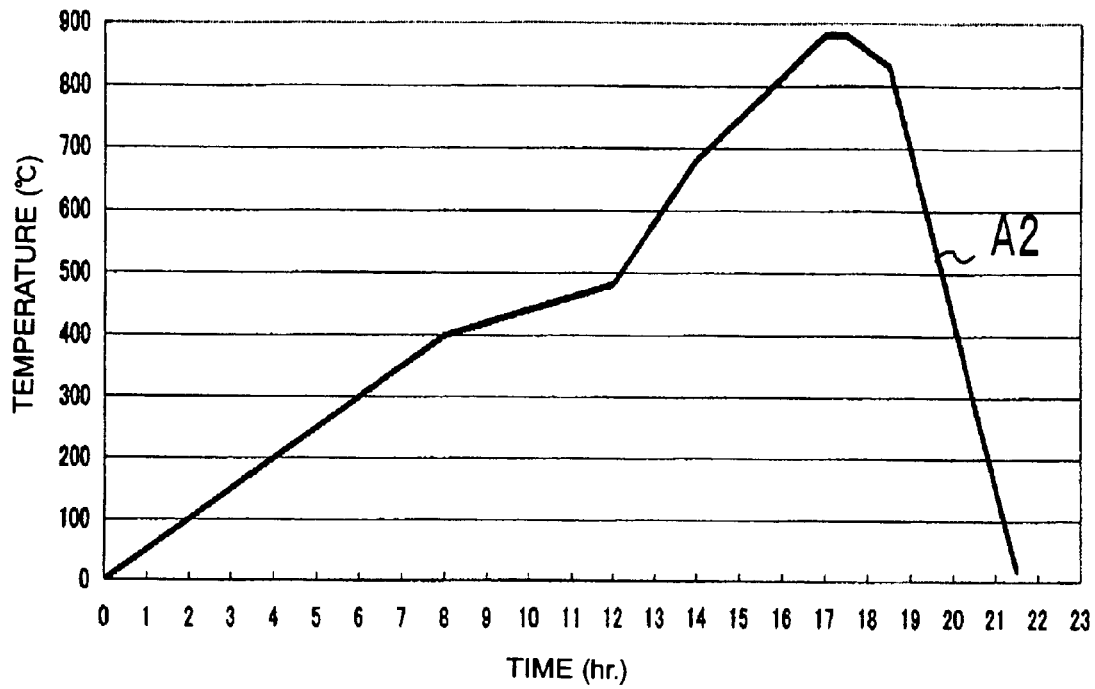
FIG. 12 is a graph showing the firing profile A2.
Figure 13:
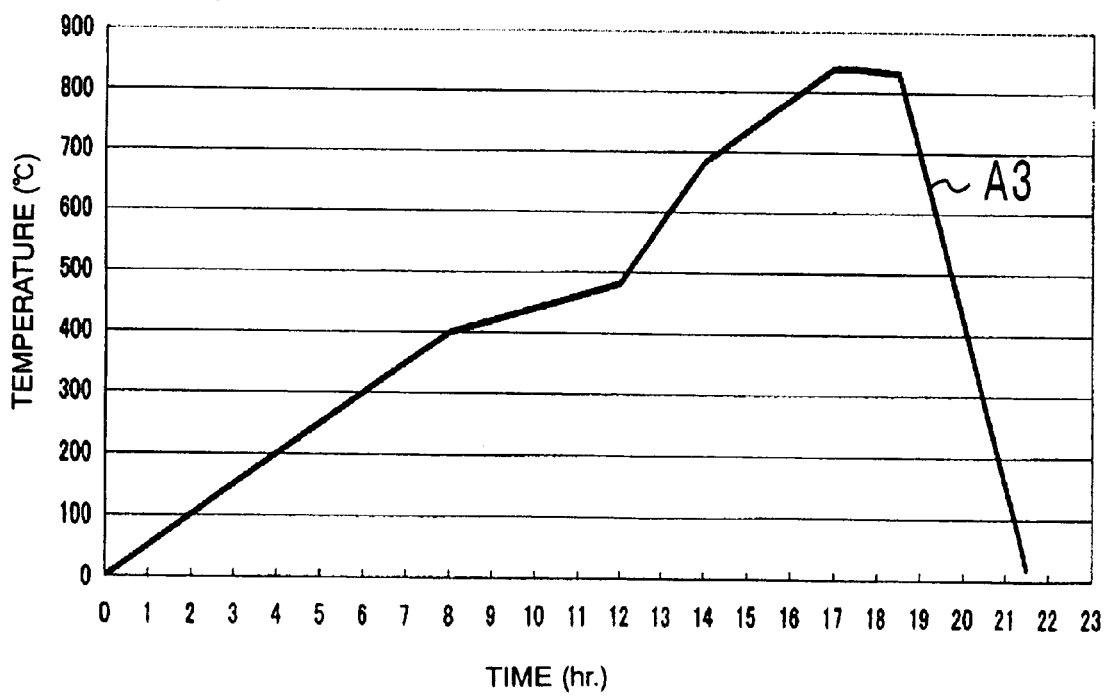
FIG. 13 is a graph showing the firing profile A3.
Figure 14:
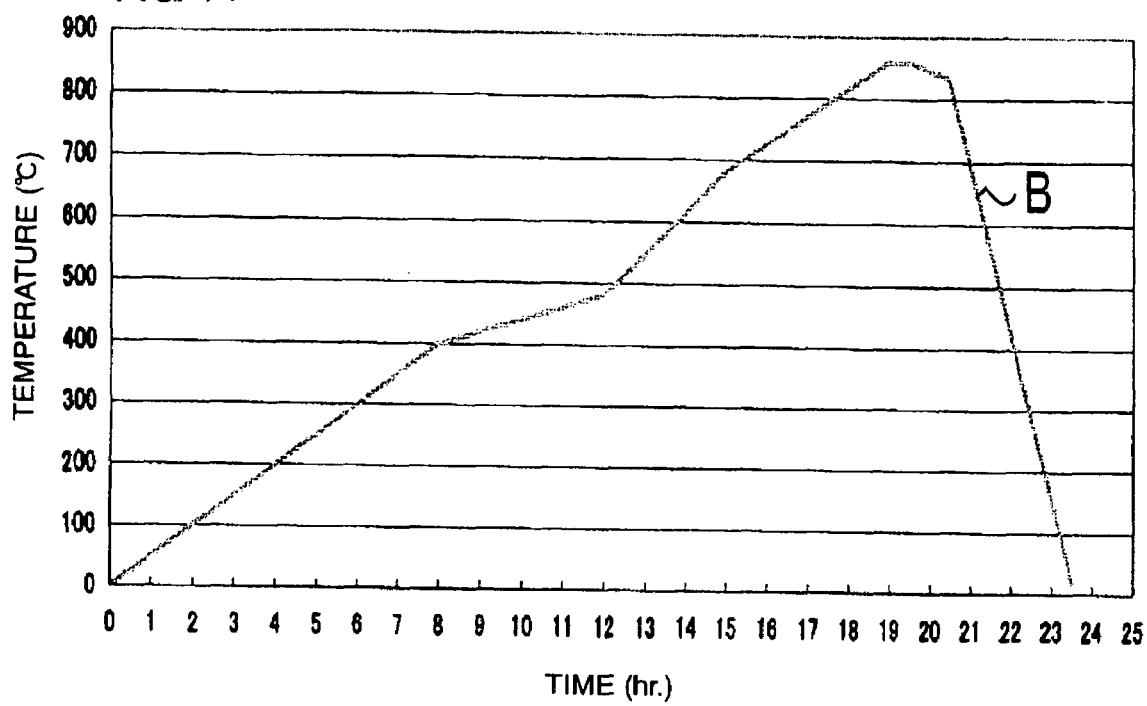
FIG. 14 is a graph showing the firing profile B.
Figure 15:
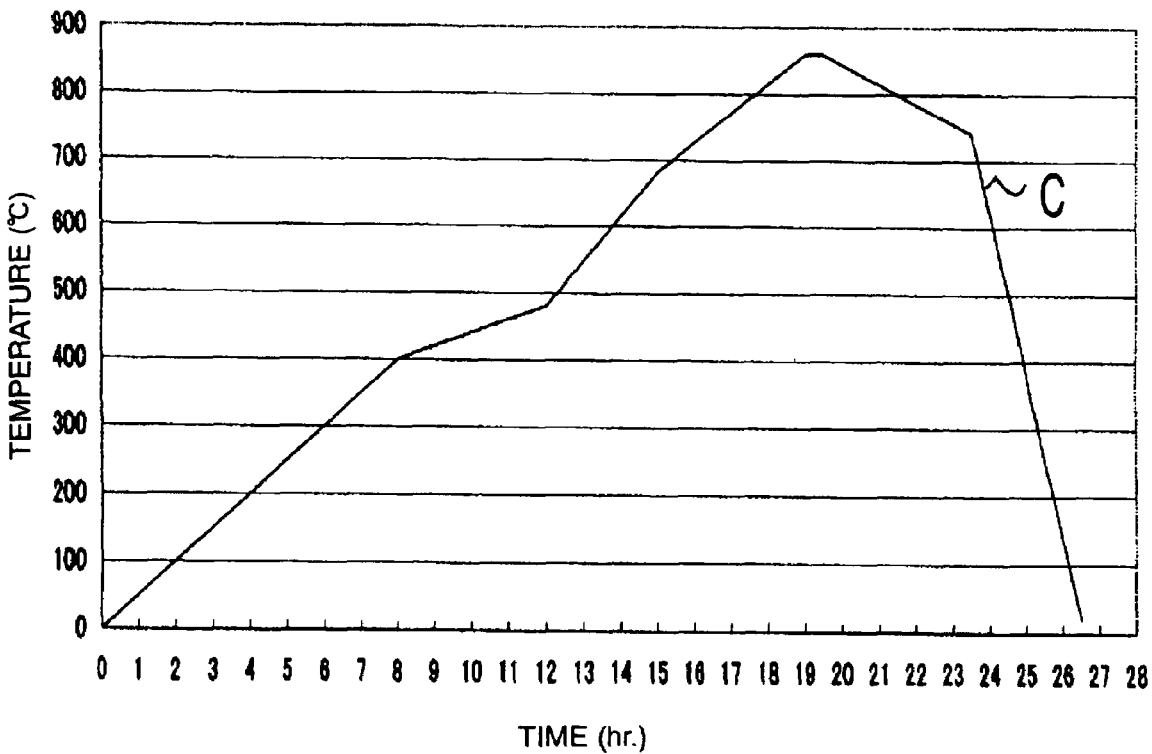
FIG. 15 is a graph showing the firing profile C.
Figure 16:
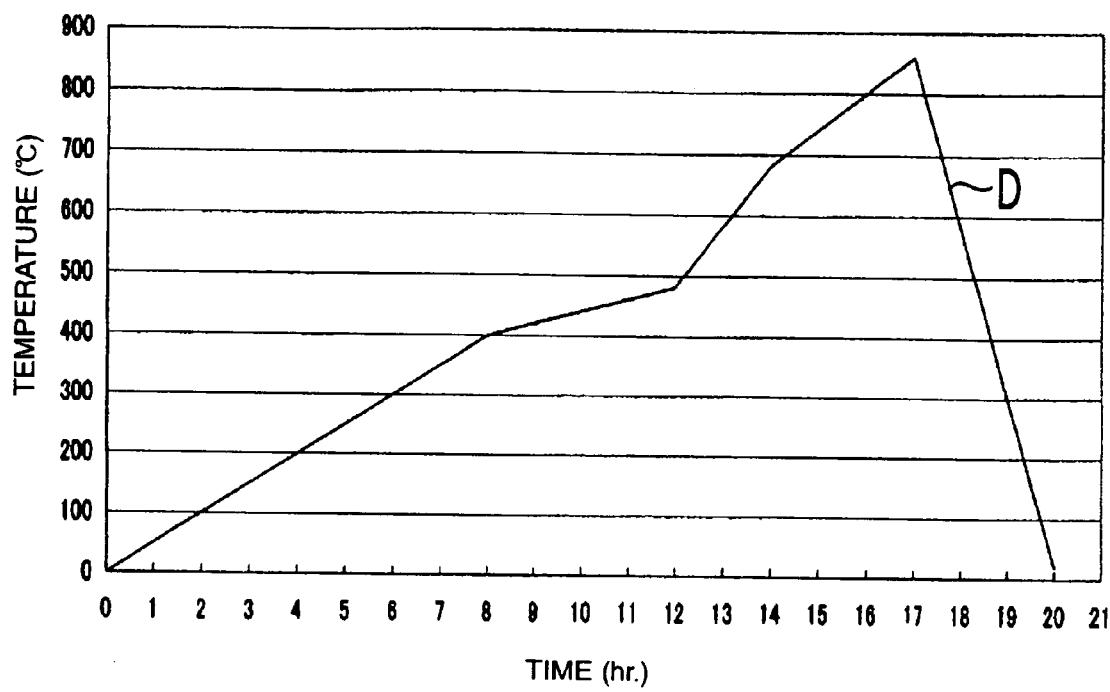
FIG. 16 is a graph showing the firing profile D.
Figure 17:
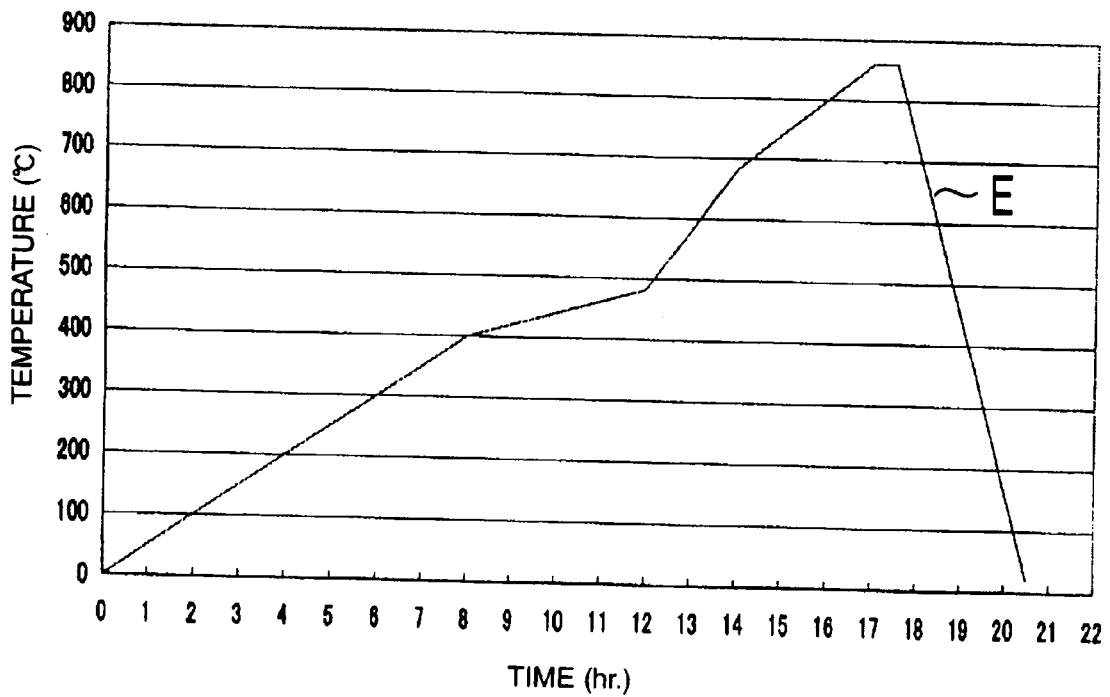
FIG. 17 is a graph showing the firing profile E.

FIGS. 11–17 show firing profiles, respectively. FIG. 11 shows the firing profile A1, FIG. 12 shows the firing profile A2 and FIG. 13 shows the firing profile A3. FIG. 14 shows the firing profile B, FIG. 15 shows the firing profile C, FIG. 16 shows the firing profile D and FIG. 17 shows the firing profile E.

Figure 6:
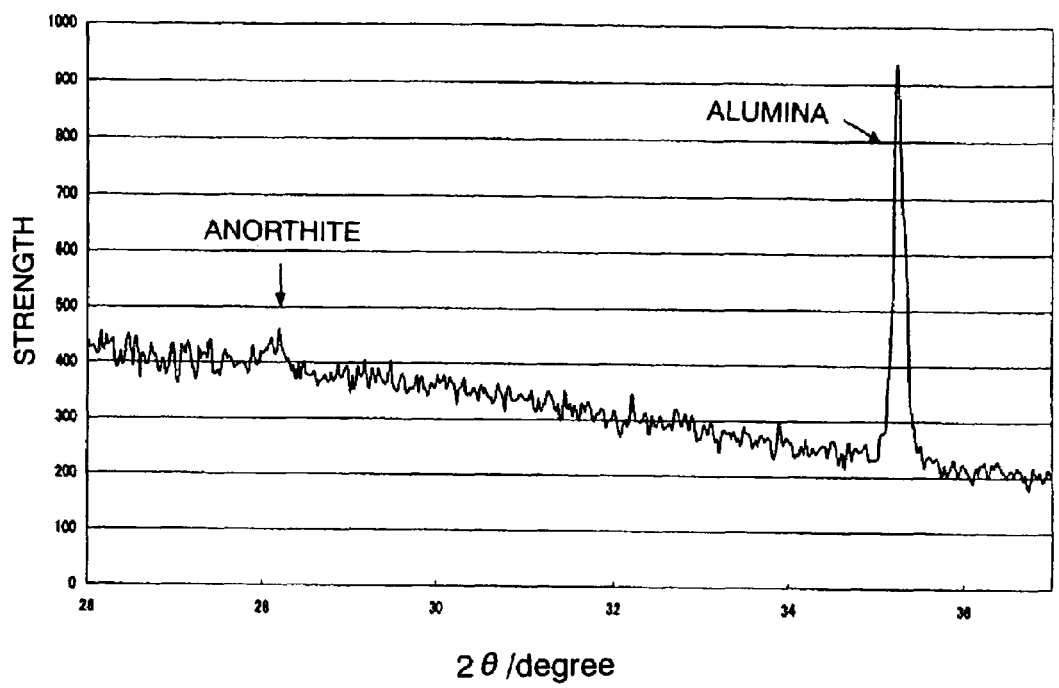
FIG. 6 is an X-ray diffraction pattern for the dielectric layer obtained through a firing profile A3.
Figure 7:
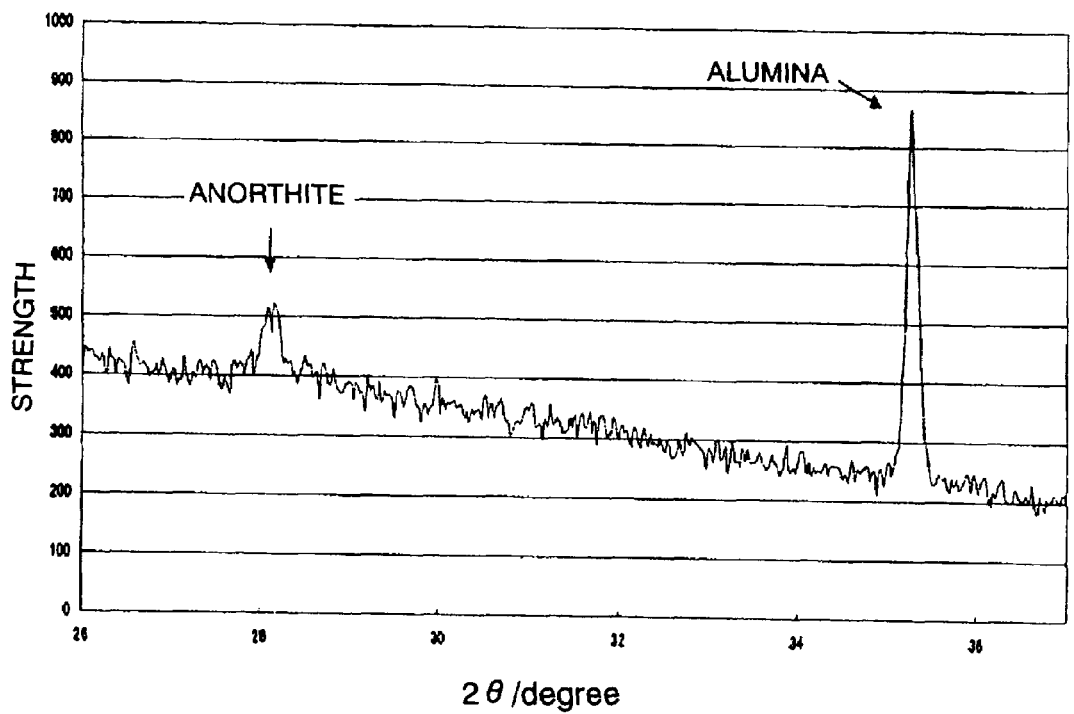
FIG. 7 is an X-ray diffraction pattern for the dielectric layer obtained through a firing profile A1.
Figure 8:
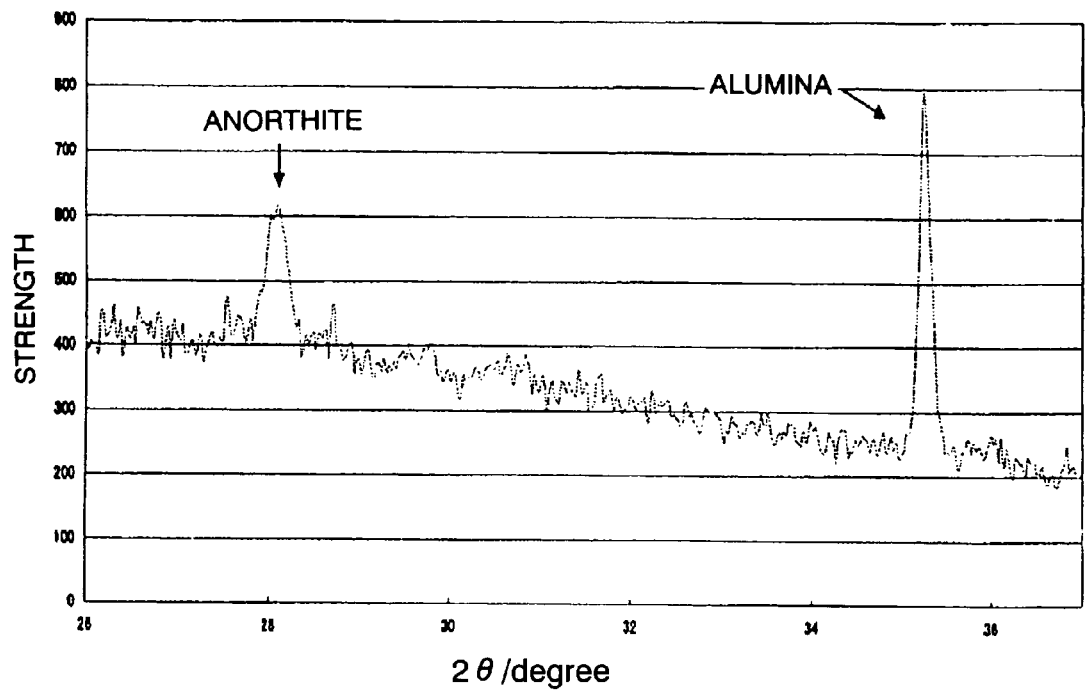
FIG. 8 is an X-ray diffraction pattern for the dielectric layer obtained through a firing profile A2.

FIGS. 6–8 show the X-ray diffraction (XRD) patterns for the dielectric layers in the multilayer ceramic substrates obtained using the firing profiles A1–A3, respectively. FIG. 6 shows an XRD pattern for the dielectric layer obtained using the firing profile A3 with a maximum firing temperature of 840° C., FIG. 7 for the dielectric layer obtained using the firing profile A1 with a maximum firing temperature of 860° C. and FIG. 8 for the dielectric layer obtained using the firing profile A2 with a maximum firing temperature of 880° C. As can be clearly seen from FIGS. 6–8, an intensity of a crystal peak for anorthite increases with the maximum firing temperature.

For the dielectric layer obtained using each firing profile, a grain size of anorthite crystals was determined using the preceding equations (1) and (2). The results are shown in Table 2.

Also for the multilayer ceramic substrate obtained using each firing profile, a bending strength was measured according to JIS R 1601 (testing method for bending strength of fine ceramics). The measurement results are shown in Table 2 and FIG. 9.

For the multilayer ceramic substrate obtained using each firing profile, an incidence of defect occurrence due to migration was measured. The measurement results are shown in Table 2 and FIG. 1.

The incidence of defect occurrence due to migration was measured according to the procedure which follows.

A resistance between neighboring two electrodes was measured using a tester and a proportion of ceramic substrates fabricated under the same firing conditions that resulted in short circuit defect was recorded as an incidence of defect occurrence due to migration.

Incidence of defect occurrence due to migration (%)= (number of ceramic substrates resulting in short circuit defect)/(number of ceramic substrates fabricated under the same firing conditions)×100.

TABLE 2

| Firing Profile | Max. Firing Temp. (° C.) | Crystal Grain Size (nm) | Incidence of Defect Occurrence (%) | Bending Strength |
|---|---|---|---|---|
| A3 | 840 | 37 | 0.2 | 240 |
| A1 | 860 | 82 | 8.3 | 225 |
| A2 | 880 | 87 | 15.4 | 242 |
| B | 860 | 78 | 5.1 | 233 |
| C | 860 | 90 | 94.9 | 239 |
| D | 860 | 1 | 0 | 211 |
| E | 860 | 63 | 1.3 | 238 |

Figure 1:
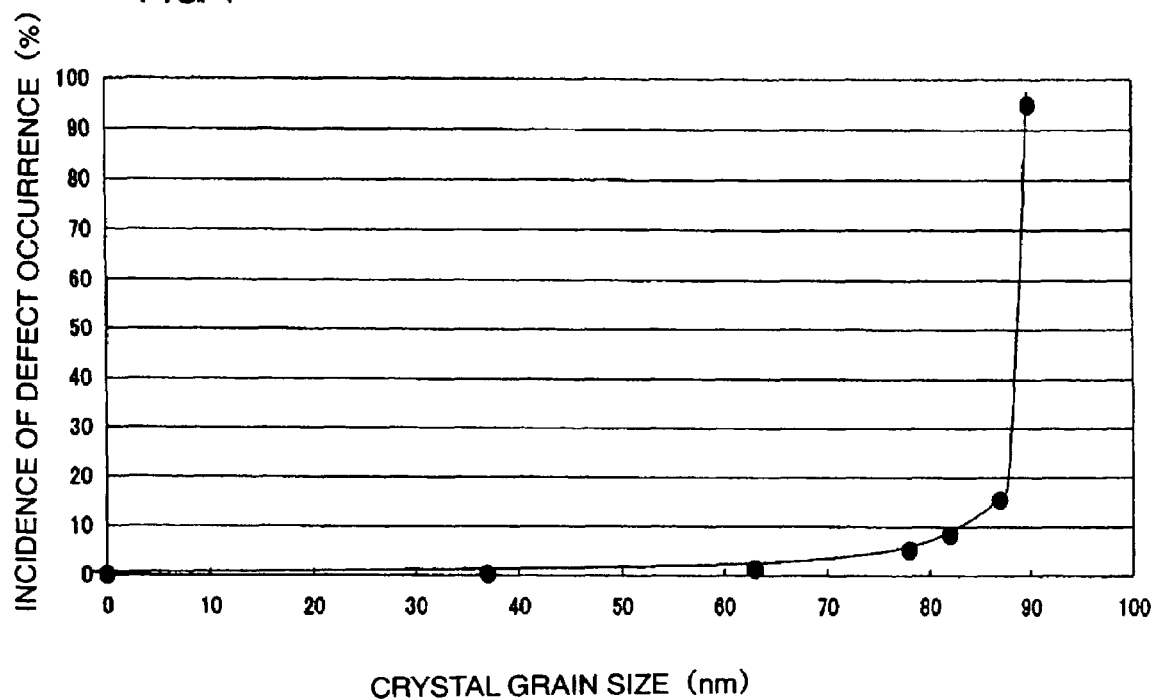
FIG. 1 is a graph showing an incidence of defect occurrence due to migration in relation to a crystal grain size.

As can be clearly seen from the results shown in FIG. 1 and Table 2, the incidence of defect occurrence due to migration does not exceed 10% when a crystal grain size is not greater than 84 nm. The incidence of defect occurrence due to migration does not exceed 5% when a crystal grain size is not greater than 78 nm. The incidence of defect occurrence due to migration does not exceed 1% when a crystal grain size is not greater than 60 nm. Accordingly, it has been found that the crystal grain size of anorthite is preferably in the range of 1 nm–84 nm, more preferably in the range of 1 nm–78 nm, particularly preferably in the range of 1 nm–60 nm.

Figure 9:
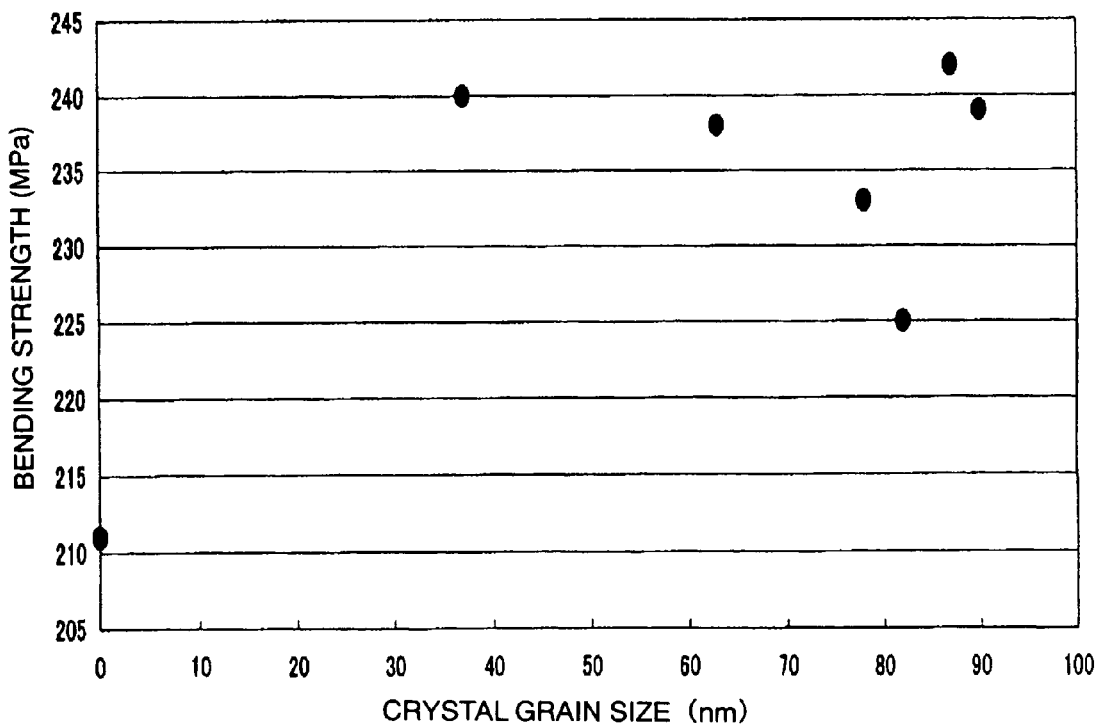
FIG. 9 shows plots of the crystal grain size versus bending strength.

As can also be clearly seen from the results shown in FIG. 9 and Table 2, the crystal grain size is not correlated to the bending strength. The mechanical strength is maintained at a satisfactory level even when the crystal grain size does not exceed 84 nm.

As apparent from Table 2, the firing profiles A1, A3, B, D and E are effective in obtaining the crystal grain size of up to 84 nm.

The firing profile A1 shows a maximum temperature of 860° C. After the firing temperature reaches the maximum temperature, firing is continued for a period of about 1.6 hours until the firing temperature drops to the maximum temperature minus 50° C. The firing profile A3 shows a maximum temperature of 840° C. After the firing temperature reaches the maximum temperature, firing is continued for a period of about 1.7 hours until the firing temperature drops to the maximum temperature minus 50° C. Therefore, when the first firing method is utilized to obtain the crystal grain size of up to 84 nm, the maximum firing temperature is selected from the range of 820° C.–865° C. After the firing temperature reaches the maximum temperature, firing is continued for a period of between 1 hours and 2 hours until the firing temperature drops to the maximum temperature minus 50° C.

The firing profile B shows a maximum temperature of 860° C. After the firing temperature reaches the maximum temperature, firing is continued for a period of about 1.6 hours until the firing temperature drops to the maximum temperature minus 50° C. The firing profile D shows a maximum temperature of 860° C. After the firing temperature reaches the maximum temperature, firing is continued for a period of about 10 minutes until the firing temperature drops to the maximum temperature minus 50° C. The firing profile E shows a maximum temperature of 860° C. After the firing temperature reaches the maximum temperature, firing is continued for a period of about 40 minutes until the firing temperature drops to the maximum temperature minus 50° C.

Therefore, when the second firing method is utilized to obtain the crystal grain size of up to 84 nm, the maximum firing temperature is selected from the range of 850° C.–900° C. After the firing temperature reaches the maximum temperature, firing is continued for a period of within 40 minutes until the firing temperature drops to the maximum temperature minus 50° C. In the second firing method, a cooling rate from the maximum temperature is preferably at least 250° C./hour.

What is claimed is:

1. A multilayer ceramic substrate which is obtained by firing multilayers of ceramic green sheets each having a dielectric layer, made of a glass-ceramic material comprising a mixture of alumina and a glass containing at least Si and Ca, and an electrode layer made of Ag and formed on the dielectric layer, said multilayer ceramic substrate being characterized in that said dielectric layer after firing includes anorthite ($CaAl_2Si_2O_8$) crystals having a grain size of up to 84 nm.

2. The multilayer ceramic substrate as recited in claim 1, wherein said glass is a borosilicate glass.

3. A method for manufacturing a multilayer ceramic substrate comprising the step of firing multilayers of ceramic green sheets each having a dielectric layer, made of a glass-ceramic material comprising a mixture of alumina and a glass containing at least Si and Ca, and an electrode layer made of Ag and formed on the dielectric layer, wherein the firing step is performed such that said dielectric layer after firing includes anorthite crystals having a grain size of up to 84 nm.

4. The method for manufacturing a multilayer ceramic substrate as recited in claim 3, having a maximum firing temperature selected from the range of 820° C.–865° C. and, after a firing temperature reaches the maximum temperature, firing is continued for a period of between 1 hour and 2 hours until the firing temperature drops to the maximum temperature minus 50° C.

5. The method for manufacturing a multilayer ceramic substrate as recited in claim 3, having a maximum firing temperature selected from the range of 850° C.–900° C. and, after a firing temperature reaches the maximum temperature, firing is continued for a period of within 40 minutes until the firing temperature drops to the maximum temperature minus 50° C.

6. The method for manufacturing a multilayer ceramic substrate as recited in claim 5, a cooling rate from the maximum temperature of at least 250° C./hour.

* * * * *